US007976335B2

(12) United States Patent
Weber et al.

(10) Patent No.: US 7,976,335 B2

(45) Date of Patent: Jul. 12, 2011

(54) LED CONNECTOR ASSEMBLY WITH HEAT SINK

(75) Inventors: Ronald Martin Weber, Annville, PA (US); Christopher George Daily, Harrisburg, PA (US); Charles Raymond Gingrich, III, Mechanicsburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 12/428,152

(22) Filed: Apr. 22, 2009

(65) Prior Publication Data

US 2009/0203254 A1 Aug. 13, 2009

Related U.S. Application Data

(63) Continuation of application No. 11/742,611, filed on May 1, 2007, now Pat. No. 7,540,761.

(51) Int. Cl.
*H05K 1/00* (2006.01)

(52) U.S. Cl. ....... 439/487; 439/76.1; 313/317; 362/373; 362/380

(58) Field of Classification Search .................. 439/487, 439/76.1, 485; 313/317, 318.01, 318.12; 362/373, 800

See application file for complete search history.

(56) References Cited

U.S. PATENT DOCUMENTS

| | | | | |
|---|---|---|---|---|
| 6,787,999 | B2 * | 9/2004 | Stimac et al. ................... | 315/51 |
| 7,083,305 | B2 * | 8/2006 | Galli ............................. | 362/294 |
| 7,293,898 | B2 * | 11/2007 | Kumthampinij et al. ..... | 362/294 |
| 2007/0268707 | A1 * | 11/2007 | Smester ........................ | 362/362 |
| 2007/0279921 | A1 * | 12/2007 | Alexander et al. ............ | 362/368 |
| 2008/0232119 | A1 * | 9/2008 | Ribarich ....................... | 362/373 |

FOREIGN PATENT DOCUMENTS

DE 202008001026 U1 4/2008

* cited by examiner

*Primary Examiner* — Gary F. Paumen

(57) ABSTRACT

A universal mounting supports high intensity LEDs in a lighting fixture with heat removal and electrical connection facilities. A holder includes a peripheral sidewall defining a cavity for accepting a printed circuit board assembly. A support member supports the printed circuit board assembly along the peripheral sidewall. Electrical contact elements are provided the printed circuit board. A thermal conduction member is in thermal communication with the printed circuit board assembly. The receptacle portion removably engages with the holder portion. A plurality of contact sockets conductively engages the electrical contact elements of the holder portion to interconnect the contact elements to external wires. An aperture in the receptacle portion accepts the thermal conduction member, wherein the thermal conduction member passes through the aperture and into a space for dissipating heat from the printed circuit board.

9 Claims, 5 Drawing Sheets

LED CONNECTOR ASSEMBLY WITH HEAT SINK

This application is a continuation of copending patent application Ser. No. 11/742,611 filed May 1, 2007, which is herein incorporated by reference in its entirety.

FIELD OF THE INVENTION

The present invention is directed to electronic components, and more particularly to a universal holder assembly for light emitting diodes (LEDs).

BACKGROUND

The use of high intensity LEDs for general-purpose illumination, and in specialty lighting applications such as architectural and video display applications, has increased in recent years. Typically, manufacturers of LED lighting assemblies design assemblies that are customized for the specific LED devices that are used in the illuminated displays. The electrical interconnections and thermal characteristics of the assemblies are often treated as secondary issues, and dealt with separately from the mechanical and esthetic aspects of the lighting fixture. This frequently results in thermal and interconnection problems with the LED assembly packaging. The heat accumulation may damage the LEDs themselves, resulting in shorter useful life of the LEDs, or cause damage to the light fixture housings such as warping and discoloration.

What is needed is a standard holder for high-intensity LEDs that integrates electrical and thermal connections in a single receptacle. Other features and advantages will be made apparent from the present specification. The teachings disclosed extend to those embodiments that fall within the scope of the claims, regardless of whether they accomplish one or more of the aforementioned needs

SUMMARY OF THE INVENTION

In one aspect, the present invention is directed to a universal mounting assembly. The mounting assembly supports high intensity LEDs in a lighting fixture. The mounting assembly includes a holder portion and a receptacle portion. The holder portion includes a peripheral sidewall defining a cavity for accepting a printed circuit board assembly. A support member is disposed along the peripheral sidewall to support the printed circuit board assembly. A plurality of electrical contact elements are provided for connecting LEDs mounted on the printed circuit board. A thermal conduction member is configured to thermally communicate with the printed circuit board assembly. The receptacle portion is configured to removably engage the holder portion. The receptacle portion has a plurality of contact sockets configured to conductively engage the plurality of electrical contact elements of the holder portion, to interconnect the plurality of contact elements to external wires of the light fixture. An aperture is arranged in the receptacle portion to accept the thermal conduction member; wherein the thermal conduction member passes through the aperture and into a space for dissipating heat from the printed circuit board.

In another embodiment, the present invention is directed to a universal mounting assembly for supporting high intensity LEDs in a lighting fixture. The mounting assembly has a holder portion with a peripheral sidewall defining a cavity for accepting a printed circuit board assembly. At least one support member is disposed along the peripheral sidewall to support the printed circuit board assembly containing LEDs. A plurality of electrical contact elements is provided within the holder portion to connect to external wires of the light fixture. A thermal conduction member is in thermal communication with the printed circuit board assembly. An aperture in the holder portion is arranged to accept the thermal conduction member. The thermal conduction member passes through the aperture and into a space for dissipating heat from the printed circuit board.

In another embodiment, the present invention is directed to a mounting assembly for supporting at least one high intensity LED in a lighting fixture. The mounting assembly has a first portion and a second portion. The first portion includes a frame portion and a plurality of integral electrical conductors. The integral electrical conductors are arranged about a perimeter of the frame for connection to corresponding electrical contact pads disposed on a PCB. At least one high intensity LED is mounted on the PCB. The second portion is retentively engageable in thermal contact with the first portion. The second portion extends axially from the first portion for dissipation of heat from the PCB disposed within the first portion. The second portion has a cavity to connect it to the first portion, and has at least one base portion of the second portion to support the first portion within the cavity.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to refer to the same or like parts.

DETAILED DESCRIPTION OF THE INVENTION

Figure 2:
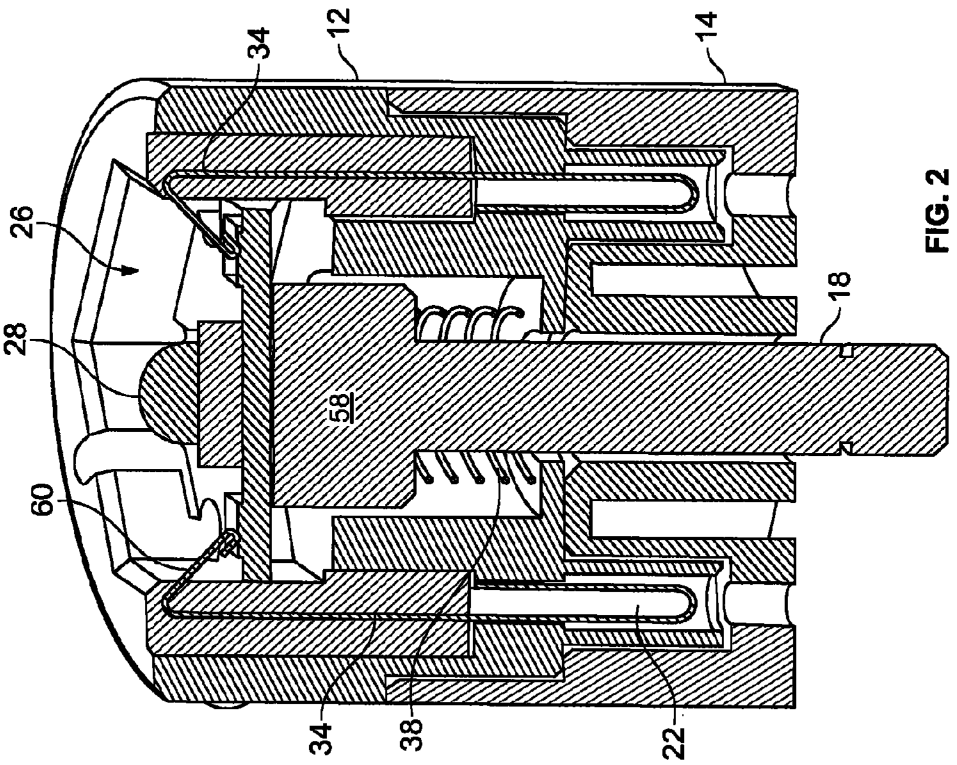
FIG. 2 is a cross-sectional view of the assembled holder and socket connector.
Figure 1:
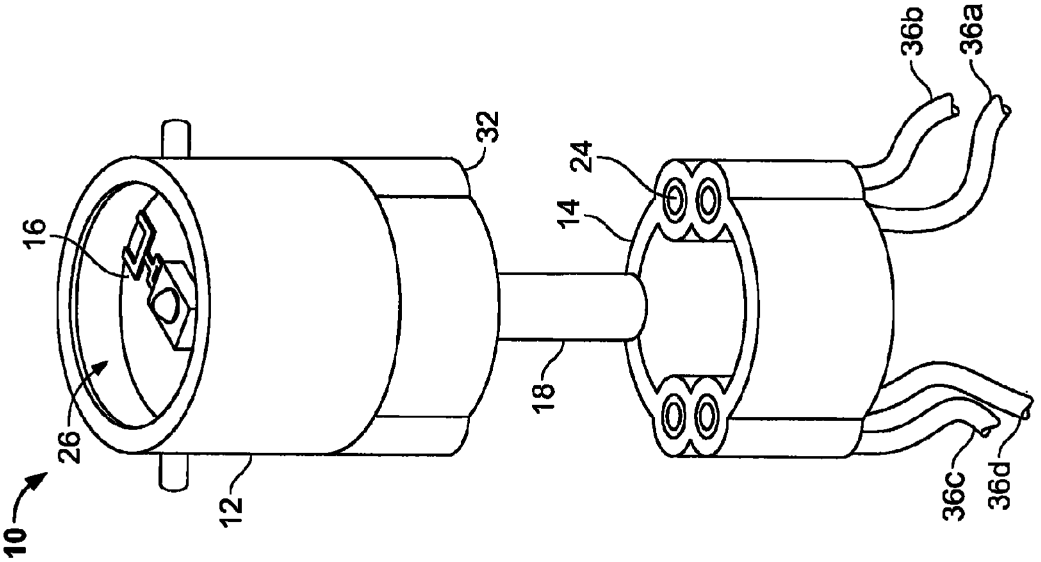
FIG. 1 is an exploded view of an LED connector assembly holder and socket connector.

The present invention is a universal LED connector assembly that accepts a conventional LED printed circuit board (PCB) containing at least one high intensity LED. The PCB can be of conventional construction, or may include thermally conductive cladding such as aluminum. Each LED circuit board represents a component or pixel of a larger image or light source. The LED connector assembly is designed to be independent of the actual LED device that is used. The LED PCBs are for use in various architectural and general-purpose lighting fixtures, signs and video displays, traffic signals and various other applications using high intensity LEDs. The lighting fixture typically provides a housing or structure that supports the LED light source. The structure provides power connections to the LED light source, and provides openings through which the light shines when the light source (or sources) is energized. When used herein, the word lighting fixture is meant to include all general and specific-application LED devices that employ high intensity LEDs, and not limited to lighting fixtures for building illumination. Examples of lighting fixtures include track mounted spotlights utilizing incandescent bulbs, and walkway lights using incandescent or halogen bulbs.

Referring to FIGS. 1-5, an LED connector assembly 10 includes a holder portion 12 and a connector portion 14. The holder portion 12 removably engages the connector portion 14 by inserting contact pins 22 (see, e.g., FIG. 4) into sockets 24. An LED PCB assembly 16 is rigidly supported in a recess 26 of the holder portion. The LED PCB assembly 16 has at least one LED 28 mounted thereon, but may include several LEDs if desired. For example, a common configuration for the LED PCB assembly includes three LEDs of red, green and blue (RGB) light for controllably varying the combinations to create virtually any color light. For each color another contact pair is required in the socket. For example, and RGB will require six individual contacts arranged around the outside of the LED PCB.

A heat sink 18 is supported within the holder portion 12 by an internal support ring 42, and is retained in position by a circular locking clip 30 or other similar spacer. The heat sink 18 contacts the bottom side of the LED PCB assembly 16 and extends downward below the bottom edge 32 of the holder portion 12. The heat sink 18 extends into and through the connector portion 14 when the holder portion 12 is engaged, and provides a thermal path for dissipating heat generated by the LED PCB assembly 16. The heat sink may be constructed of any suitable thermal conductor. By way of example and not by limitation, the heat sink material may be copper, aluminum or die-cast zinc. In an alternate embodiment, the heat sink 18 may also be a heat pipe. In the drawings the heat sink 18 is shown as a generally circular cylinder with a flat circular head portion 58, however, the shape may vary depending on the application to provide additional exposed surface for heat dissipation. For example, the heat sink 18 may include heat fins, fluting, or other shapes for increased heat dissipation, as will be readily appreciated by those persons skilled in the art. Thermally conductive grease or thermally conductive pad may be applied to the flange or head portion 58 to promote the transfer of heat from the LED PCB 16.

The LED PCB assembly 16 preferably snaps into position in the holder portion 12 and is retained by angled tips 60 of contact fingers 34 connected to contact pins 22. The contact fingers 34 and contact pins 22 provide electrically conductive paths to lead wires 36*a*-36*d*, through contact sockets 24. A spring 38 applies compressive force between the heat sink 18 and the bottom of LED PCB assembly 16, while simultaneously applying a normal force to the contact fingers 34. A washer 40 rests on the locking clip 30 and retains the spring 38 in position between washer 40 and LED PCB assembly 16.

Figure 3:
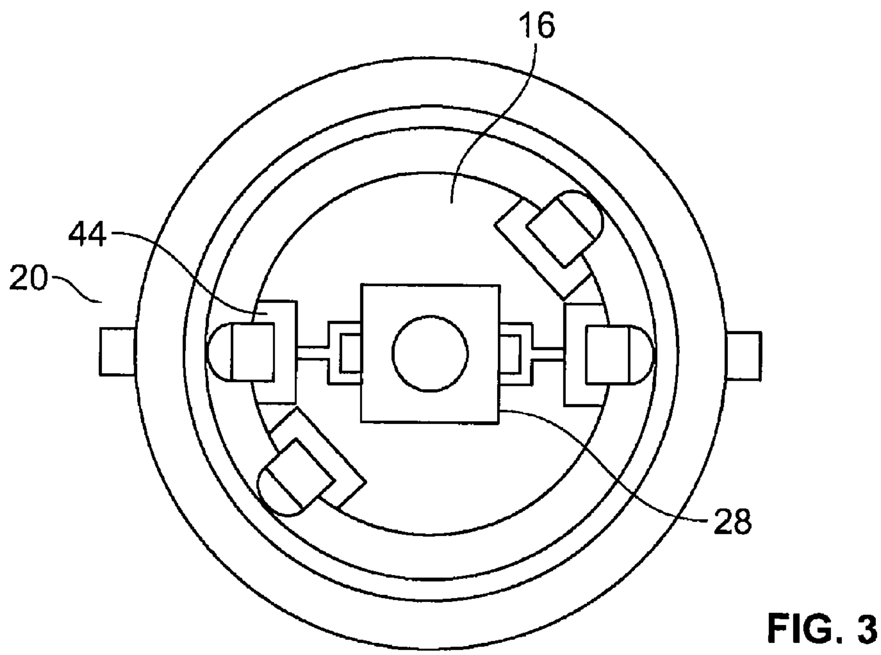
FIG. 3 is a top plan view of the holder.
Figure 4:
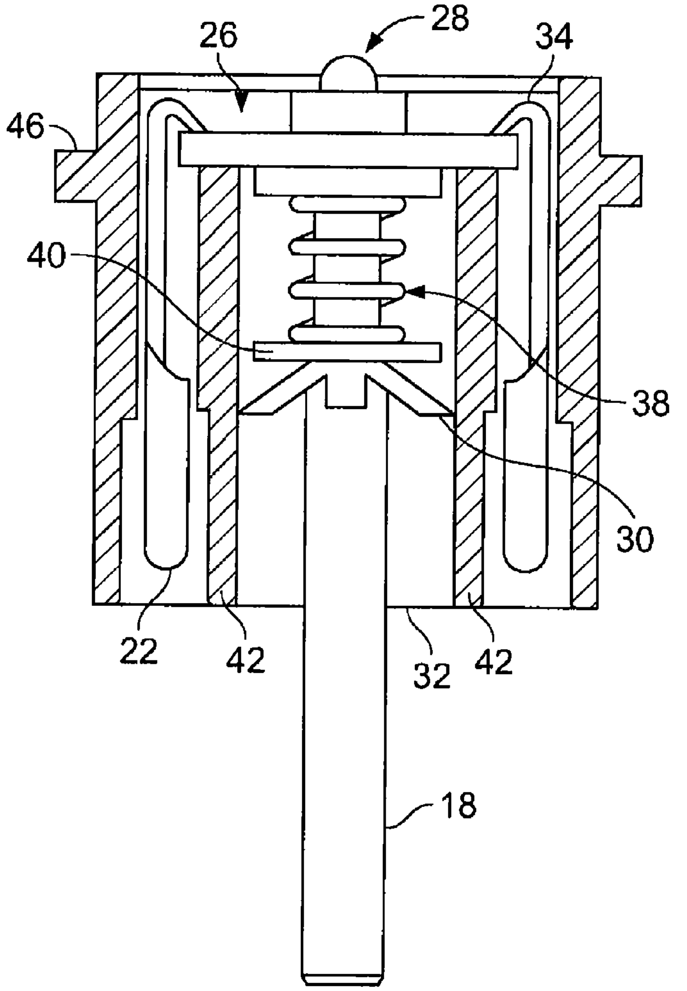
FIG. 4 is a cross-sectional view of the holder taken along the lines 3-3 in FIG. 2.
Figure 5:
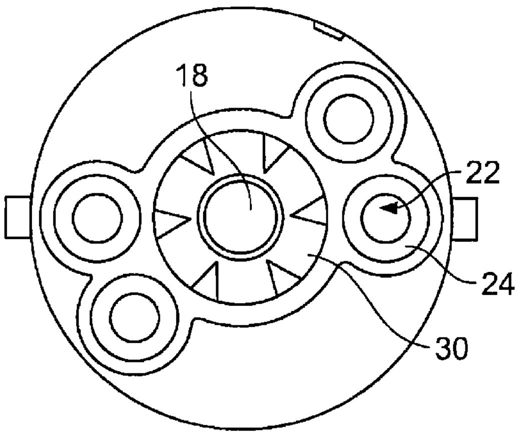
FIG. 5 is a bottom plan view of the holder.

Referring to FIG. 3, one or more LEDs 28 are electrically connected through the PCB assembly 16 to electrical interconnection pads 44 (See, e.g., FIG. 3) disposed at the periphery of the PCB assembly 16 and aligned with the contact fingers 34 for locking engagement. There are two interconnection pads 44 required for each LED that is mounted on the LED PCB assembly 16. In the exemplary embodiment illustrated in FIG. 3, two LEDs can be accommodated by the four interconnection pads 44 shown, although the PCB assembly 16 that is depicted includes only a single LED. More interconnection pads 44 may be added as required to accommodate the total number of LEDs. Likewise, the number of contact fingers 34 and sockets 24 must correspond with the number of interconnection pads 44. The number of contacts that may be arranged around the periphery is only limited by the geometry of the PCB assembly 16. Additional interconnects may be used for communications or control wiring for one or more LED fixtures (not shown). A typical LED PCB assembly includes an LED light source mounted on a composite substrate of an electrically insulating top layer, e.g., FR4 or micarta board, optionally including a metallic bottom layer for improved heat conduction, e.g., aluminum or copper. Bayonet lugs 20 are optionally formed on the holder portion 12 for attachment of the LED connector assembly 10 to a customer's light fixture lens assembly, or other structure into which the LED connector assembly is to be mounted. Alternate attachment means for the LED connector assembly may include threaded connections or snap-fit connections (not shown).

Figure 6:
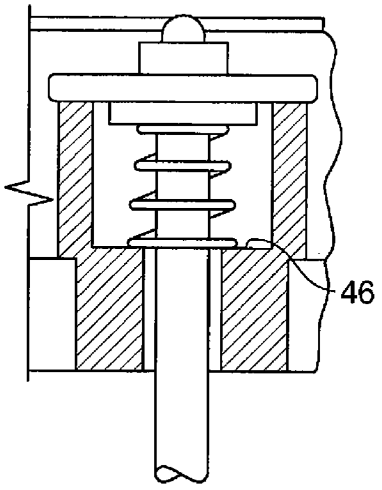
FIG. 6 is a cross-sectional view of an alternate embodiment of the holder.
Figure 7:
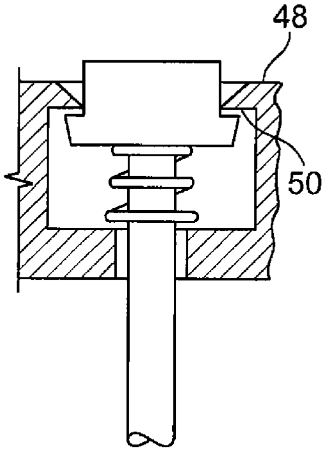
FIG. 7 is a cross-sectional view of another alternate embodiment of the holder.

In another embodiment shown in FIG. 6, the heat sink 18 may be retained within the holder portion 12 by a molded shelf portion 46 of the internal support ring 42, replacing the locking clip 30 and washer 40 in the embodiment described above. Another arrangement for maintaining the position of the heat sink 18 is shown in FIG. 7. In this arrangement, a latching edge 48 engages with a rim portion 50 of the heat sink 18. The rim portion 50 is maintained against the latching edge 48 by spring 38. This arrangement has fewer parts by eliminating, for example, the washer and clip, and is therefore easier to assemble and to integrate into a lighting fixture. The PCB assembly floats between the contact fingers 34 and the heat sink 18. The contact fingers 34 apply downward force and the heat sink 18 applies opposite force to maintain the LED PCB assembly 16 in position, i.e., the heat sink 18 pushes upward against the LED PCB assembly 16.

Figure 8:
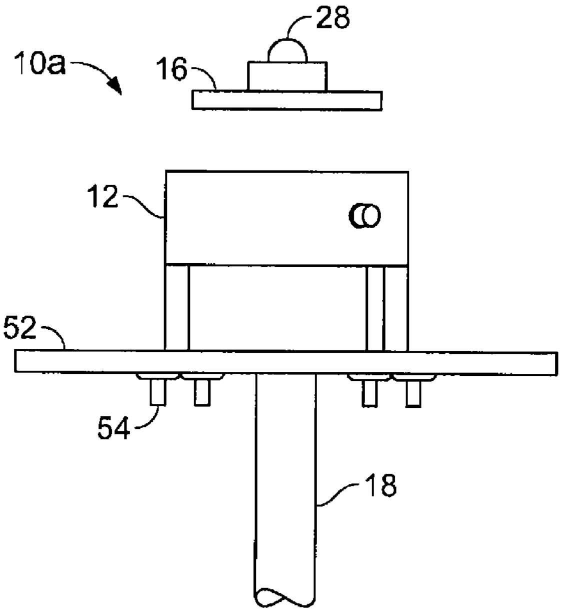
FIG. 8 is an alternative embodiment of the LED connector assembly mounted on a PCB.

The connector portion 14 may optionally be eliminated within the scope of the invention. Referring again to FIG. 4, the contact pins 22 may be eliminated and replaced with solder tails or press fit tails snap-in connectors. This would eliminate the need for a connector portion 14, which may be replaced by a substrate 52 (see, e.g., FIG. 8), by direct attachment to another PCB (not shown) or left unsupported. In the embodiment shown in FIG. 8, the alternate LED connector assembly 10*a* includes the PCB holder portion 12 mounted on a substrate 52, either by soldering or mechanical fasteners. A plurality of connector terminal portions 54 extends from the holder portion 12 through the substrate. External wiring (not shown) is connected to the connector terminal portions 54 to power the LEDs and any associated control or communications devices of the light fixture or device into which the LED connector assembly 10 is fastened. The heat sink 18 also protrudes below the substrate 52 and is exposed to an air space below for dissipating heat. The air space may include airflow driven by a fan to supplement or enhance the heat dissipation characteristics of the heat sink 18. The LED PCB assembly 16 snaps into position in the holder 10*a*.

Figure 9:
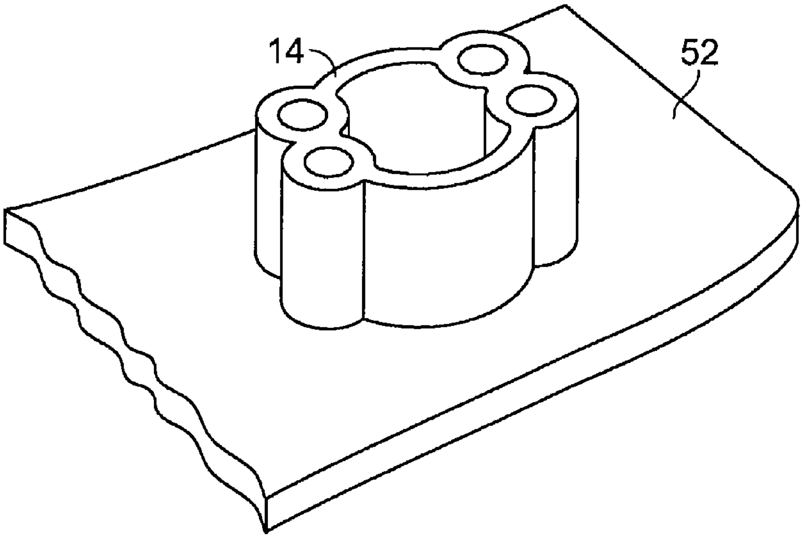
FIG. 9 is a socket connector mounted on a PCB.

Referring next to FIG. 9, the connector portion 14 may optionally be mounted on a substrate 52, and the holder portion 12 plugged into the connector portion 14, with terminal portions 54 extending from the opposite side of the substrate 52, and heat sink 18 protruding below the substrate as described above.

Figure 11:
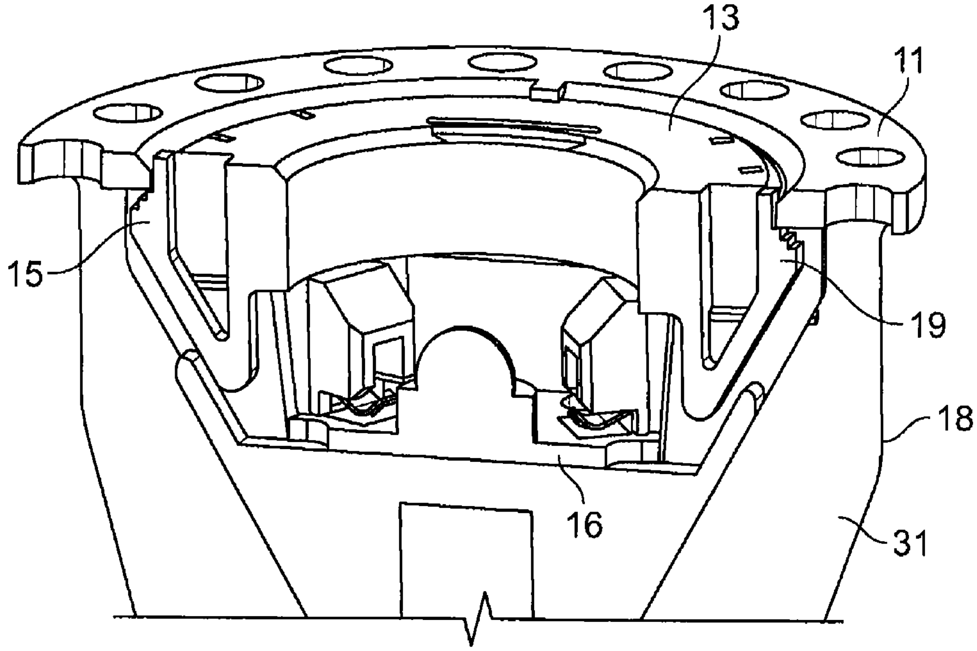
FIG. 11 is a partial sectional view of the alternate embodiment of FIG. 10.
Figure 10:
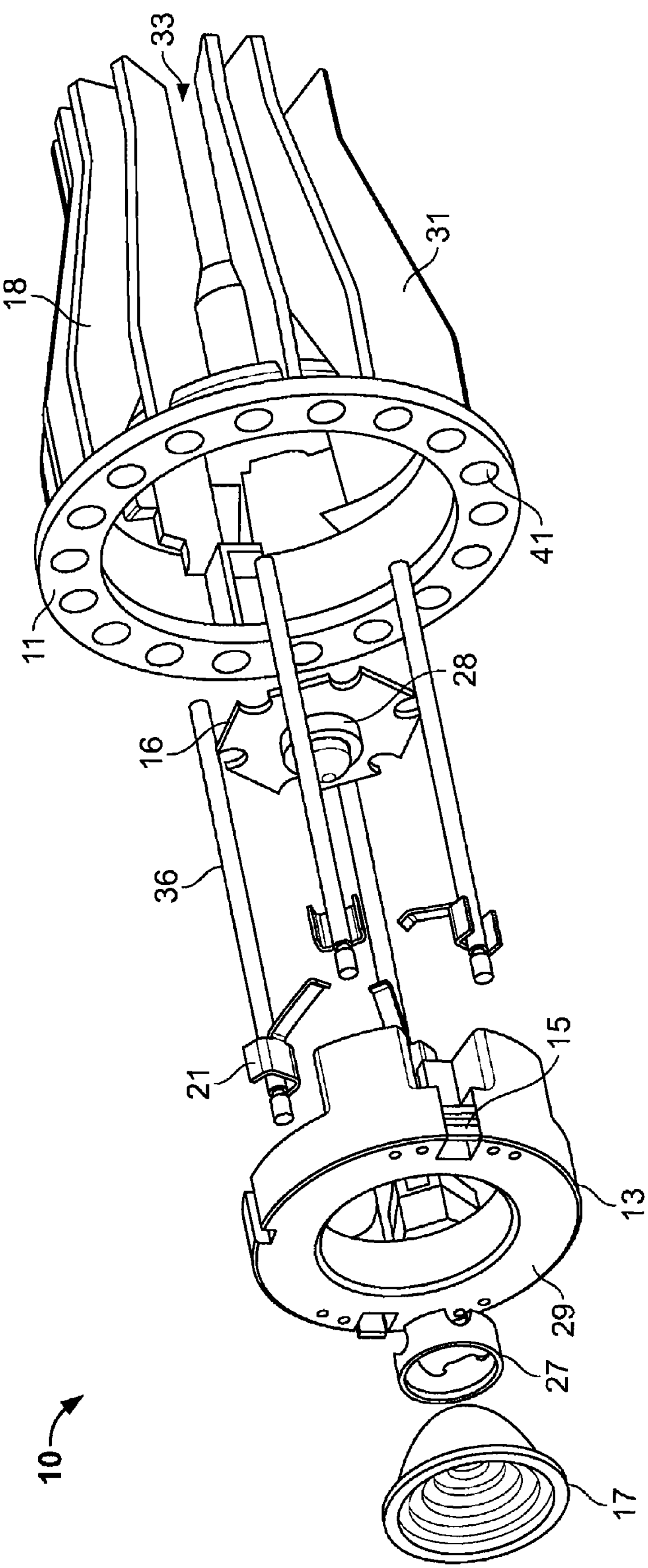
FIG. 10 is an exploded view of an alternate embodiment.

Referring next to FIGS. 10 and 11, an alternate embodiment of the LED connector assembly 10 has a modified heat sink 18 with a fluted shape that provides additional surface area for dissipating heat. In one embodiment, the heat sink 18 is designed with a complementary outer ring, similar to conventional halogen bulbs, e.g., types GU10 or MR16 standard bulbs having outer rings on the reflector assembly, to permit the LED pixel assembly 10 to be directly substituted for the conventional bulbs. Alternately, the rear portion of the heat sink may be threaded (not shown) to fit into a threaded lighting fixture. The LED PCB assembly 16 rests atop individual flute portions 31 projecting radially inward from the outer radius of the heat sink 18. Wire leads 36 have crimped contacts 21 that may be inserted into a contact carrier portion 13 and extend downward through channels 33 defined by the flute portions 31. The number of contacts/wire leads 36 depends on the number of LEDs 28 that are mounted on the LED PCB assembly 16. The LEDs may have two wire leads 36 for each of the LEDs 28, or a plurality of LEDs may share a common ground or neutral wire. Various LED interconnections may be used, and the number of wire leads shown in the drawings is exemplary only, and not intended to limit the scope of the invention. The contact carrier portion 13 slides into the heat sink 18 against the LED PCB assembly 16 and latches into place under a flange portion 11. The latches 15 secure the LED PCB assembly 16 into position, and force the electrical contacts portions 21 against the contact pads for positive electrical contact. The latches 15 also maintain thermal contact between the LED PCB assembly 16 and the heat sink 18. In one embodiment, the latches 15 include step portions 19 to accept LED PCB assemblies 16 of multiple thicknesses. An optional lens portion 17 and lens connector 27 may be inserted in the LED connector assembly 10 to enhance the optical characteristics of the LED or LEDs 28 mounted thereon. Lip portions 29 are formed in the flange portion 11 and engage the lens portion 17 by spring force supplied by spring 38 (see, e.g., FIG. 4), to maintain the lens portion 17 in position. In one embodiment, flange portion 11 may include apertures 41 to provide airflow passages for improved heat dissipation.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A connector assembly for a light emitting diode comprising:

a holder portion comprising a recess for accepting a printed circuit board assembly having a light emitting diode mounted thereon;

a plurality of electrical contact elements in electrical communication with the printed circuit board assembly; and a heat sink in thermal communication with the printed circuit board assembly, the heat sink configured to dissipate heat generated by the connector assembly; and a connector portion comprising an aperture arranged to accept the heat sink, and a plurality of contact sockets configured to conductively engage the plurality of electrical contact elements, the heat sink extending through the connector portion when the holder portion is engaged with the connector portion.

2. The connector assembly of claim 1 further comprising:

a cavity disposed in the holder portion, and at least one support member disposed within the cavity to support the printed circuit board assembly.

3. The connector assembly of claim 2, further comprising a sidewall of the cavity and at least one support member disposed along the sidewall.

4. The connector assembly of claim 3, further comprising:

a spring disposed between the heat sink and the at least one support member, the spring arranged to apply compressive force between the heat sink and the printed circuit board assembly, and to apply normal force to the electrical contact elements;

the heat sink comprising a flange portion adjacent to a first end of the spring; and the spring configured to maintain the flange portion against the printed circuit board.

5. The connector assembly of claim 4, further comprising:

the spring seated on a washer at an end of the spring opposite the flange portion; and a circular locking clip engaged with the heat sink to lock the washer in a predetermined position along the heat sink.

6. The connector assembly of claim 3, further comprising:

at least one bayonet lug disposed on an exterior of the sidewall, the at least one bayonet lug insertable into a channel in a lighting fixture.

7. The connector assembly of claim 6, further comprising:

a shelf portion disposed on the support member; and the spring seated on the shelf portion at a first end of the spring opposite the flange portion.

8. The connector assembly of claim 6, further comprising:

a latching edge directed inwardly on the support member; and a rim portion maintained against the latching edge of the spring.

9. The connector assembly of claim 1 further comprising:

each electrical contact element of the plurality of electrical contact elements include a finger portion; each finger portion including an angled portion; and the angled portion engageable with the printed circuit board assembly.

* * * * *